(12) United States Patent
Hwang et al.

(10) Patent No.: US 10,448,528 B2
(45) Date of Patent: Oct. 15, 2019

(54) HOUSING, METHOD OF MANUFACTURING THE SAME, ELECTRONIC DEVICE INCLUDING THE SAME

(71) Applicant: Samsung Electronics Co., Ltd., Gyeonggi-do (KR)

(72) Inventors: Dong Hyeon Hwang, Gyeonggi-do (KR); Sung Jin Park, Gyeonggi-do (KR); Byoung Ju Ahn, Gyeonggi-do (KR); Kwang Youn Lee, Gyeonggi-do (KR); Young Jin Yi, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/603,896

(22) Filed: May 24, 2017

(65) Prior Publication Data

US 2017/0347476 A1    Nov. 30, 2017

(30) Foreign Application Priority Data

May 27, 2016    (KR) .................... 10-2016-0065596

(51) Int. Cl.
| | |
|---|---|
| *H05K 7/14* | (2006.01) |
| *G06F 1/16* | (2006.01) |
| *H05K 5/02* | (2006.01) |
| *C23C 16/44* | (2006.01) |
| *H05K 5/00* | (2006.01) |
| *C25D 11/12* | (2006.01) |

(52) U.S. Cl.
CPC ........... *H05K 5/0243* (2013.01); *C23C 16/44* (2013.01); *C25D 11/12* (2013.01); *G06F 1/1656* (2013.01); *H05K 5/0017* (2013.01); *H05K 7/1427* (2013.01)

(58) Field of Classification Search
None
See application file for complete search history.

(56) References Cited

U.S. PATENT DOCUMENTS

| | | |
|---|---|---|
| 8,398,841 B2 | 3/2013 | Khosla |
| 8,828,553 B2 | 9/2014 | Khosla |
| 8,968,548 B2 | 3/2015 | Lai et al. |

(Continued)

FOREIGN PATENT DOCUMENTS

| | | |
|---|---|---|
| KR | 20030061040 | 7/2003 |
| KR | 1020140048327 | 4/2014 |
| KR | 1020160010101 | 1/2016 |

OTHER PUBLICATIONS

European Search Report dated Oct. 9, 2017 issued in counterpart application No. 17173093.0-1972, 7 pages.

*Primary Examiner* — Xanthia C Cunningham
(74) *Attorney, Agent, or Firm* — The Farrell Law Firm, P.C.

(57) ABSTRACT

A housing of an electronic device is provided. The housing includes a first surface, a second surface, a side surface surrounding at least a portion of a space formed between the first surface and the second surface, a first surface layer formed by applying a first texture and a first color to a first area of at least one of the first surface, the second surface, and the side surface of the housing, and a second surface layer formed by applying a second texture and a second color to a second area within the first area, wherein at least one of the first surface layer and the second surface layer includes an oxide film layer.

11 Claims, 11 Drawing Sheets

(56) References Cited

U.S. PATENT DOCUMENTS

| | | |
|---|---|---|
| 9,506,160 B2 | 11/2016 | Khosla |
| 9,518,333 B2* | 12/2016 | Mag ................. B32B 37/02 |
| 2003/0000409 A1* | 1/2003 | Blake ................ B41C 1/1033 |
| | | 101/454 |
| 2008/0309589 A1* | 12/2008 | Morales ............. G06F 1/1626 |
| | | 345/36 |
| 2011/0017602 A1 | 1/2011 | Khosla |
| 2011/0308961 A1* | 12/2011 | Chu ................... C25D 11/02 |
| | | 205/316 |
| 2011/0317343 A1* | 12/2011 | Shin ............... B29C 45/14811 |
| | | 361/679.01 |
| 2013/0043135 A1 | 2/2013 | Demers et al. |
| 2013/0075262 A1* | 3/2013 | Teng .................. C25D 11/26 |
| | | 205/50 |
| 2013/0153428 A1* | 6/2013 | Akana ................ C25D 11/20 |
| | | 205/50 |
| 2013/0153429 A1 | 6/2013 | Khosla |
| 2013/0161322 A1* | 6/2013 | Li ....................... B41M 1/30 |
| | | 220/62.14 |
| 2013/0299357 A1 | 11/2013 | Lai et al. |
| 2013/0319865 A1* | 12/2013 | Browning ............ B23P 11/00 |
| | | 205/50 |
| 2014/0152890 A1* | 6/2014 | Rayner ................ G06F 1/1626 |
| | | 348/376 |
| 2014/0178647 A1* | 6/2014 | Kim .................... B44C 5/0407 |
| | | 428/166 |
| 2014/0197380 A1* | 7/2014 | Sung ................... H01L 27/3241 |
| | | 257/40 |
| 2014/0268525 A1* | 9/2014 | Hwang ............... B29C 45/0053 |
| | | 361/679.01 |
| 2014/0346049 A1 | 11/2014 | Khosla |
| 2015/0016030 A1* | 1/2015 | Browning ............ C23C 28/00 |
| | | 361/679.01 |
| 2015/0173222 A1* | 6/2015 | Demers ............... G06F 1/16 |
| | | 312/223.1 |
| 2017/0066011 A1* | 3/2017 | Kole ................... B05D 5/005 |

* cited by examiner

HOUSING, METHOD OF MANUFACTURING THE SAME, ELECTRONIC DEVICE INCLUDING THE SAME

PRIORITY

This application claims priority under 35 U.S.C. § 119(a) to Korean Patent Application Serial number 10-2016-0065596, which was filed on May 27, 2016 in the Korean Intellectual Property Office, the entire disclosure of which is incorporated herein by reference.

BACKGROUND

1. Field of the Disclosure

The present disclosure relates, generally, to an electronic device, and more particularly, to housings configured for use with electronic devices, and methods of manufacturing the same.

2. Description of the Related Art

An electronic device, such as, a smart phone, may include a housing. The housing may fix and support inner elements (e.g., a display, a camera module, a printed circuit board, and the like) of the electronic device. For example, a printed circuit board, on which a processor, a memory, or a communication module is mounted, may be seated and fixed onto an inner side of the housing.

The housing may have various designs, textures and colors. For example, a certain texture and a certain color are applied to one surface of the housing, and a different texture and a different color may be applied to another surface of the housing.

However, in a conventional electronic devices, it may be difficult to apply multiple textures and multiple colors to the same surface of the housing. For example, it may be difficult to apply a first texture and a first color to a first area of one surface of the housing and to apply a second texture and a second color to a second area, which is included in the first area and is present on the same surface as that of the first area. For example, the first texture and the first color may be damaged when the second texture and the second color are applied to the housing.

SUMMARY

The present disclosure has been made to address at least the disadvantages described above and to provide at least the advantages described below.

Accordingly, an aspect of the present disclosure is to provide a method of manufacturing a housing, capable of preventing a texture and a color from being damaged in a remaining area other than a second area by forming a film on a first area implemented in a first texture and a first color and by exposing the second area to be implemented in a second texture and a second color, a housing manufactured through the method, and an electronic device including the housing.

In accordance with an aspect of the present disclosure, there is provided a housing of an electronic device. The housing includes a first surface, a second surface, a side surface surrounding at least a portion of a space formed between the first surface and the second surface, a first surface layer formed by applying a first texture and a first color to a first area of at least one of the first surface, the second surface, and the side surface of the housing, and a second surface layer formed by applying a second texture and a second color to a second area within the first area, wherein at least one of the first surface layer and the second surface layer includes an oxide film layer.

In accordance with another aspect of the present disclosure, there is an electronic device including a housing which includes a first surface, a second surface, and a side surface surrounding a portion of a space formed between the first surface and the second surface, a display module seated inside the housing, a printed circuit board seated inside the housing, a first surface layer formed by applying a first texture and a first color to a first area of at least one of the first surface, the second surface, and the side surface of the housing, and a second surface layer formed by applying a second texture and a second color to a second area within the first area, wherein at least one of the first surface layer and the second surface layer includes an oxide film layer.

In accordance with another aspect of the present disclosure, there is provided a method of manufacturing a housing of an electronic device. The method includes applying a first texture to a first area of the housing, applying a first color to the first area, forming a film in the first area, exposing a second area within the first area, applying a second texture to the second area, applying a second color to the second area, and removing the film, wherein at least one of applying the first color and applying the second color includes performing anodizing.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features and advantages of certain embodiments of the present invention will be more apparent from the following detailed description taken in conjunction with the accompanying drawings, in which.

DETAILED DESCRIPTION

Figure 1:
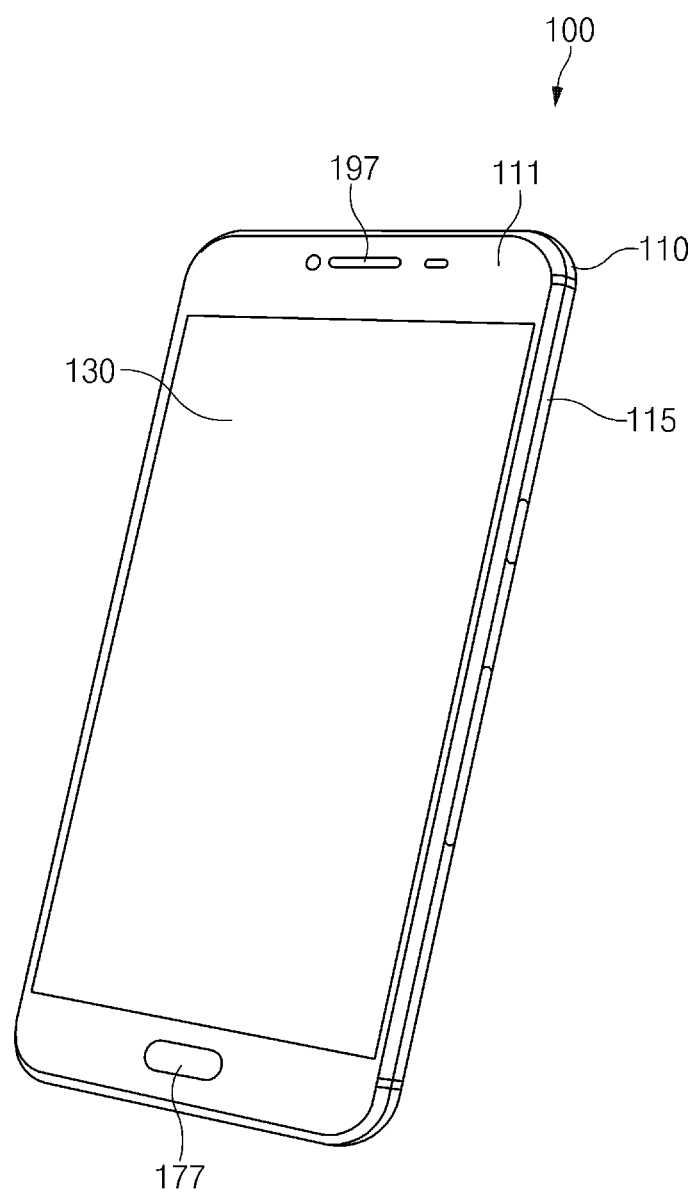
FIG. 1 is a perspective view of an electronic device, according to an embodiment of the present disclosure.

Embodiments of the present disclosure will be described herein below with reference to the accompanying drawings. However, the embodiments of the present disclosure are not limited to the specific embodiments and should be construed as including all modifications, changes, equivalent devices and methods, and/or alternative embodiments of the present disclosure. In the description of the drawings, similar reference numerals are used for similar elements.

The terms and words used in the following description and claims are not limited to the dictionary meanings, but, are merely used by the inventor to enable a clear and consistent understanding of the present disclosure. Accordingly, the following description of various embodiments of the present disclosure is provided for illustration purpose only and not for the purpose of limiting the present disclosure as defined by the appended claims and their equivalents.

Singular forms "a," "an," and "the" include plural referents unless the context clearly dictates otherwise. Thus, for example, reference to "a component surface" includes reference to one or more of such surfaces.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may modify various elements regardless of an order and/or importance of the corresponding elements, and do not limit the corresponding elements. These terms may be used for the purpose of distinguishing one element from another element. For example, a first user device and a second user device may indicate different user devices regardless of the order or importance. For example, a first element may be referred to as a second element without departing from the scope the present invention, and similarly, a second element may be referred to as a first element.

When an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, when an element (for example, a first element) is "directly coupled with/to" or "directly connected to" another element (for example, a second element), there is no intervening element (for example, a third element) between the element and another element.

The expression "configured to (or set to)" as used herein may be replaced with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . ." may mean that the apparatus is "capable of . . ." along with other devices or parts in a certain context. For example, "a processor configured to (set to) perform A, B, and C" may mean a dedicated processor (e.g., an embedded processor) for performing a corresponding operation, or a generic-purpose processor (e.g., a CPU or an application processor) capable of performing a corresponding operation by executing one or more software programs stored in a memory device.

The term "module" as used herein may mean a unit including one of hardware, software, and firmware or a combination of two or more of them. A "module" may be interchangeably used with, for example, the term "unit", "logic", "logical block", "component", or "circuit". A "module" may be a minimum unit of an integrated component element or a part thereof. A "module" may be a minimum unit for performing one or more functions or a part thereof. A "module" may be mechanically or electronically implemented. For example, a "module" according to the present invention may include at least one of an application-specific integrated circuit (ASIC) chip, a field-programmable gate arrays (FPGA), and a programmable-logic device for performing operations which has been known or are to be developed hereinafter.

The terms used in describing the various embodiments of the present disclosure are just for the purpose of describing particular embodiments and are not intended to limit the present disclosure. As used herein, the singular forms are intended to include the plural forms as well, unless the context clearly indicates otherwise.

All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the present disclosure An electronic device according to the present disclosure may include at least one of a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

The electronic device may be a home appliance. The home appliance may include at least one of a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

The electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, a security device, an automotive head unit, a robot for home or industry, an automatic teller machine (ATM), point of sales (POS) device, or an Internet of Things (IoT) device (e.g., a light bulb, a sensor, electric or gas meter, a sprinkler device, a fire alarm, a thermostat, a streetlamp, a toaster, sporting goods, a hot water tank, a heater, a boiler, etc.).

The electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may be a combination of one or more of the aforementioned various devices. The electronic device may also be a flexible device. Further, the electronic device is not limited to the aforementioned devices, and may include an electronic device according to the development of new technology.

Herein, the term "user" may indicate a person using an electronic device or a device (e.g., an artificial intelligence electronic device) using an electronic device.

Figure 2:
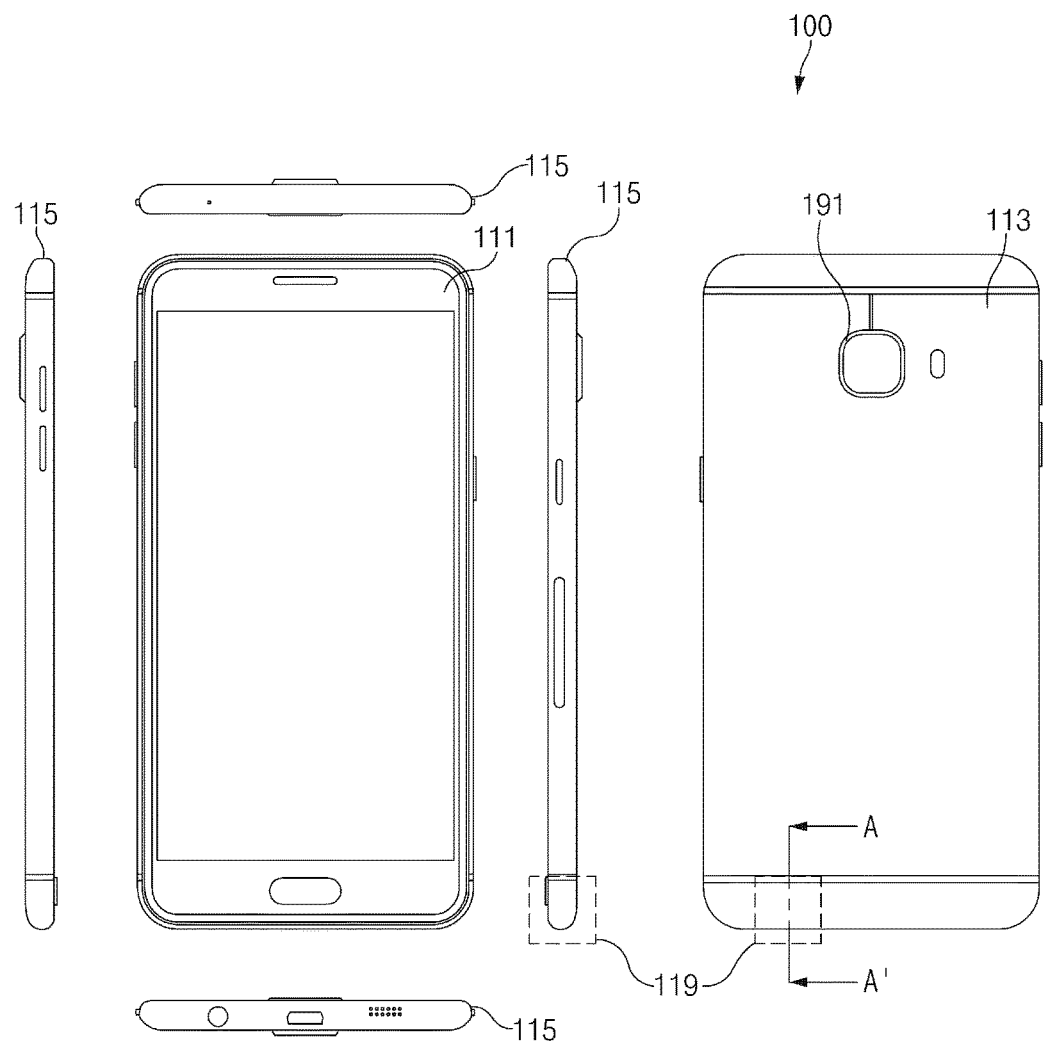
FIG. 2 is a six-sided view of an electronic device, according to an embodiment of the present disclosure.
Figure 3:
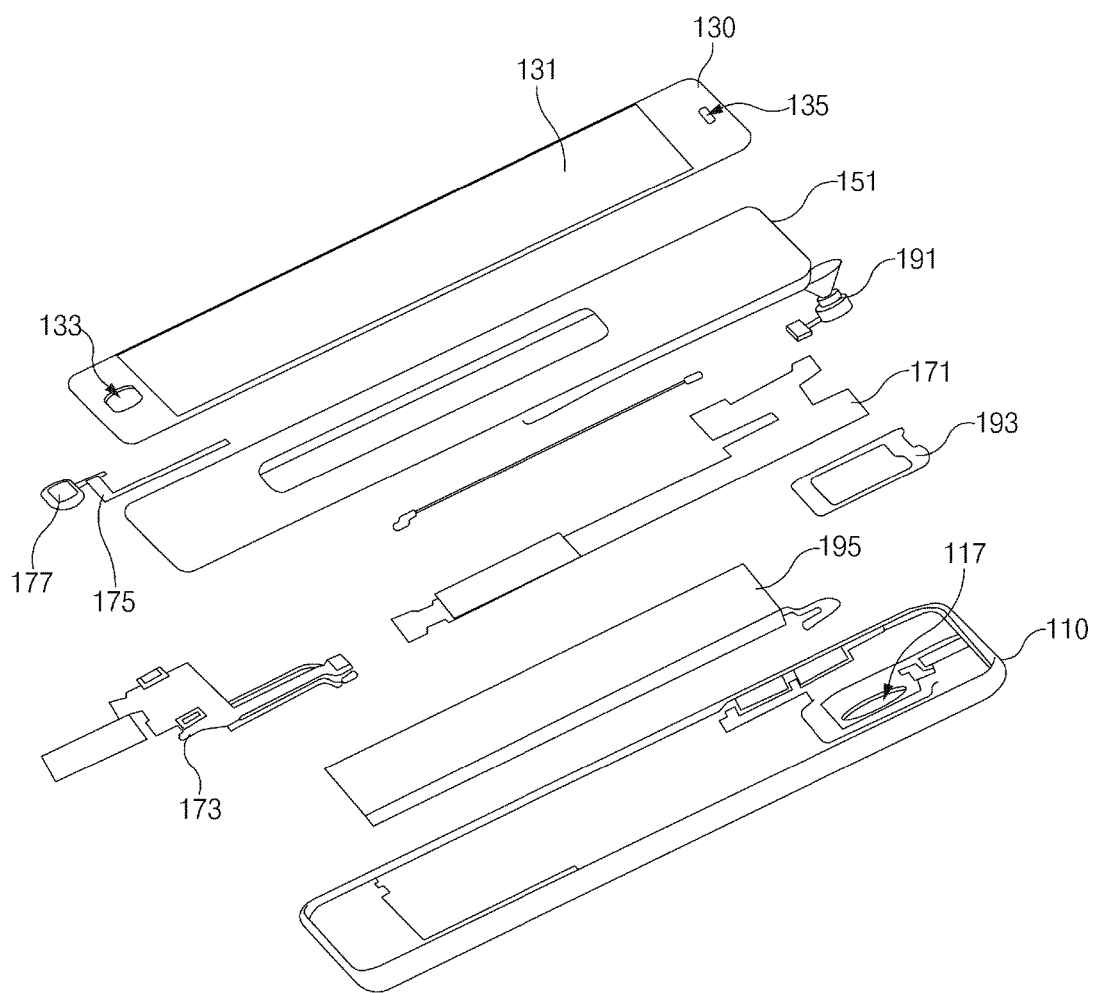
FIG. 3 is an exploded view of an electronic device, according to an embodiment of the present disclosure.

FIG. 1 is a perspective view of an electronic device, FIG. 2 is a six-sided view of an electronic device, and FIG. 3 is an exploded view of an electronic device, according to an embodiment of the present disclosure.

Referring to FIGS. 1 to 3, an electronic device 100 includes a housing 110, a display module 130, a bracket 151, a first printed circuit board 171, and a second printed circuit board 173. The housing 110 includes a front surface 111, a rear surface 113, and a side surface 115 surrounding a portion of a space between the front surface 111 and the rear surface 113. The housing 110 may form an appearance of the electronic device 100 and may fix and support inner elements (e.g., the display module 130, a camera module 191, and the printed circuit boards 171 and 173) of the electronic device 100.

The housing 110 may have a space, in which a battery 195 is seated, to supply power to at least one of the inner elements of the electronic device 100. In addition, the housing 110 may include an opening 117 to expose some of the inner elements out of the electronic device 100. As illustrated in FIG. 2, the opening 117 may be formed in a central upper portion of the rear surface 113 of the housing 110. The camera module 191 may be exposed out of the electronic device 100 through the opening 117.

The housing 110 may be implemented in multiple textures and multiple colors. For example, in the housing 110, the front surface 111 and the rear surface 113 may be provided in a first texture and a first color, and the side surface 115 may be provided in a second texture and a second color. The front surface 111 and the rear surface 113 may be provided in the first texture and the first color, and a portion of the front surface 111, a portion of the rear surface 113, and the side surface 115 may be provided in the second texture and in the second color.

The display module 130 may display various content (e.g., a text, an image, a video, an icon, a symbol, or etc.) for a user. The display module 130 may include a touch screen and may receive a touch input, a gesture input, a proximity input, or a hovering input by an electronic pen or a portion of a body of a user.

A front cover 131 may cover an upper layer of the display module 130. The front cover 131 may form a front appearance of the electronic device 100. At least a partial area of the front cover 131 may be formed of a transparent material (e.g., glass) such that a screen output through the display module 130 is displayed to the outside through a transparent area of the front cover 131. The front cover 131 may include openings 133 and 135 such that some of the inner elements of the electronic device 100 may be exposed out of the electronic device 100. As illustrated in FIG. 3, the first opening 133 may be formed in a central lower end portion of the front cover 131, and the second opening 135 may be formed in a central upper end portion of the front cover 131. As illustrated in FIG. 1, a physical key 177 (e.g., a home key) may be exposed out of the electronic device 100 through the first opening 133, and a speaker 197 (or a receiver) may be exposed out of the electronic device 100 through the second opening 135.

The bracket 151 may include an insulating material and may provide a space in which at least one of the inner elements of the electronic device 100 is seated. An adhesive material may be applied to a partial area of the bracket 151, or the bracket 151 may include an adhesive layer such that at least one of the inner elements is fixed to the bracket 151. As the display module 130 is seated on a front surface of the bracket 151, the front cover 131 may be coupled to the bracket 151 to cover a portion of the front surface of the bracket 151.

The bracket 151 may include an opening, and one of the inner elements may be connected with the first printed circuit board 171 and/or the second printed circuit board 173 through the opening formed in the bracket 151. The bracket 151 may have an opening formed in an area except for an edge area, and the number of openings, the shape of the opening, and/or the position of the opening may vary in number, shape, or position of the inner elements connected with the printed circuit board.

The first printed circuit board 171 and the second printed circuit board 173 may be disposed under the bracket 151, and various electronic components may be mounted on the first printed circuit board 171 and the second printed circuit board 173. For example, one electronic element or at least one circuit line may be mounted on the first printed circuit board 171 and the second printed circuit board 173, and one of the electronic elements may be electrically connected with another electronic element through at least one of the circuit lines. The electronic components may include a processor, a memory, a communication module (e.g., a communication circuit and an antenna 193), and a functional module (e.g., the camera module 191).

The physical key 177 may be mounted on a third printed circuit board 175 including a control circuit which controls the operation of the physical key 177. One of the first printed circuit board 171, the second printed circuit board 173, and the third printed circuit board 175 may include flexible printed circuit boards. In addition, the first printed circuit board 171, the second printed circuit board 173, and the third printed circuit board 175 can be electrically connected with each other.

Figure 4:
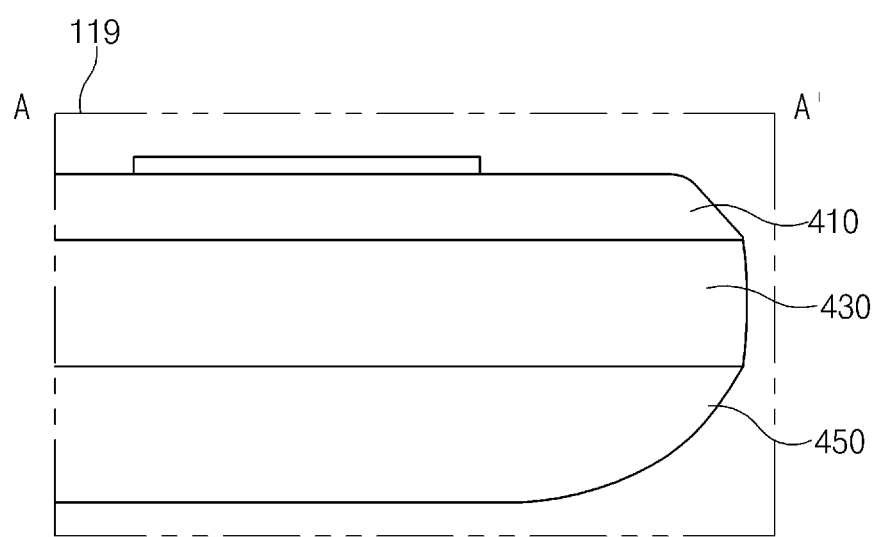
FIG. 4 is a partial sectional view taken along line A-A' of FIG. 2, according to an embodiment of the present disclosure.
Figure 5:
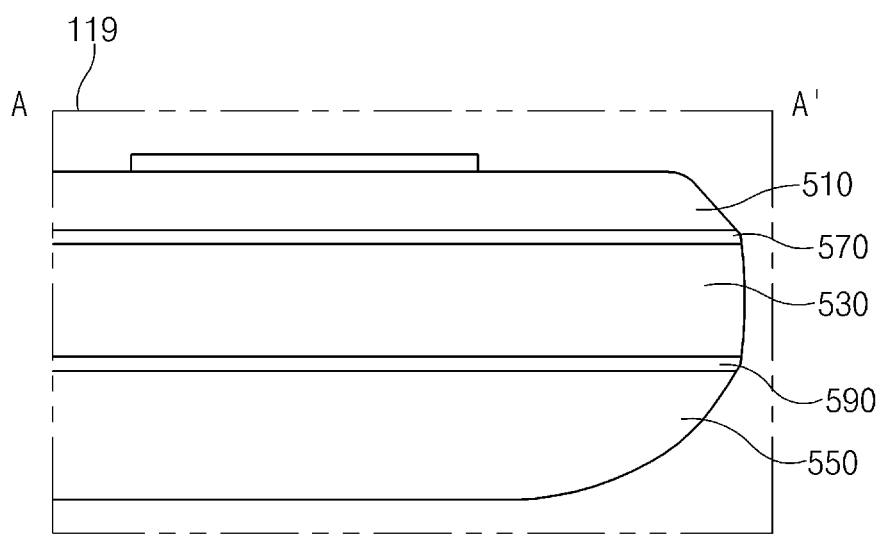
FIG. 5 is a partial sectional view taken along line A-A' of FIG. 2, according to another embodiment of the present disclosure.

FIG. 4 is a sectional view taken along line A-A' of FIG. 2 and FIG. 5 is a sectional view taken along line A-A' of FIG. 2, according to another embodiment of the present disclosure.

As noted above, the housing 110 may be provided in multiple textures and multiple colors. For example, a side surface section of the housing 110 may be implemented in multiple textures and multiple colors. FIGS. 4 and 5 illustrate an application of a texture and a color to a partial area 119 of the housing 110 illustrated in FIG. 2. The partial area 119 illustrated in FIGS. 4 and 5 may include a portion of the front surface 111, a portion of the rear surface 113, and the side surface 115 in the housing 110. The housing 110 and the side surface section (e.g., the portion of the front surface 111, the portion of the rear surface 113, and the side surface 115) may be curved. As multiple textures and multiple colors can be applied to the side surface section, the appearance of the electronic device 100 may be enhanced.

A manner of applying a texture to the housing 110 may include a sanding treatment, a hairline treatment, a hardfacing treatment, a pattern treatment, or etc. The sanding treatment may include removing scratches to smooth a surface and may employ an abrasive agent for the adhesion of paints. The hairline treatment may be used to smooth a surface by using a brush or sandpaper such that a fine line (hairline) may be produced on the surface. The hardfacing treatment can be used to produce luster on a surface by polishing the surface through a polishing process. The pattern treatment can be used to form a pattern in a specific shape on a surface through numeric control (NC) processing or laser processing. The manner of applying the texture to the housing 110 may include forming various corrosion roughness (in the range of 1 μm to 100 μm) by using a medium, such as ceramic or glass, and may include forming corrosion and a pattern through chemical etching, e.g., by utilizing acid and alkaline chemicals, including, but not limited to, nitric acid, phosphoric acid, sulfuric acid, sodium hydroxide, or etc.

Applying a color to the housing 110 may include anodizing, which can be used to form an oxide film on a metal surface and to apply a color to the surface through a chemical polishing process, an oxide film (anodizing) process, a coloring process, or a sealing process. The anodizing may enhance the housing 110, which can be formed of a metallic material, in corrosion resistance, an anti-contamination ability, and stability and light resistance (weather resistance) of a dyed and colored film.

Before the anodizing is performed, a pre-treatment process may be performed to remove foreign matters or an oxide film from the surface of a base material. As the pre-treatment process is performed, the oxide film, resulting from the anodizing, may be uniformly formed on the surface of the base material. The pre-treatment process may include a mechanical pre-treatment process and a chemical pre-treatment process. The mechanical pre-treatment process may include a process of smoothing the roughness of a surface (which can be damaged by pressing, welding, or other processes) a process of polishing the surface, a sand blasting process, or a process of bonding a barrel to the surface. The chemical pre-treatment process may include a degreasing, etching, de-smut, electrolytic polishing, or protective film removing process. The above processes may be selectively performed according to materials.

The degreasing process is a process for removing foreign matters or grease from the surface of the base material by using a surfactant or the like. The etching process is a process of removing an oxide film from the surface of the base material. If degreasing does not remove the grease, the grease may be completely removed through the etching process. In the etching process, alkaline or acidic chemicals may be used. The etching process can include an alkaline etching process or an acidic etching process according to the types of the chemicals. The de-smut process removes smut (e.g., a metal oxide) from the surface of the base material after the etching process is performed. The electrolytic polishing process electrolyzes the surface of the base material serving as an anode to perform smoothing and producing luster. In addition to the above processes, other processes may be additionally performed. For example, a washing process may be performed. The washing process can include washing the surface of the base material using distilled water after the de-smut process is performed. In addition, a chemical-mechanical polishing (CMP) process may be performed. The CMP process can make the surface of the base material a polished surface having luster by using a solution such as a strong acid solution, a strong alkali solution, or an oxidizing agent. For example, the CMP process may employ a solution in which sulfuric acid and phosphate are mixed with each other at a specific ratio (e.g., a ratio of 9:1).

The oxide film (anodizing) process forms an oxide film on the surface of the base material. In the state the base material is precipitated into a metallic salt solution, the base material is electrically conducted, thereby forming the oxide film.

The coloring process applies a color to an oxide film, which is formed through the oxide film process, using dyes. The sealing process is a process of performing sealing treatment with respect to the surface of the base material, which is colored with the dyes, by using a sealing agent to prevent the surface of the base material from being decolored. The sealing agent may include nickel (Ni), acetic acid, or etc. Additionally, a drying process may be performed to the base material subject to the sealing process, and the drying process includes processing an unnecessary portion of a corner of the base material or etching the surface of the base material.

A film formed through the anodizing process is relatively hard, has a greater corrosion resistance, has multiple fine dimples (or holes) formed in repeated patterns to exhibit porosity, and becomes in a fibrous state such that the film may be dyed in various colors. For example, dyes may be inserted into the fine dimples formed in the film and the fine dimples may be sealed through the sealing process. The film having the fine dimples may have roughness lower than that of a surface layer formed by applying a texture.

Referring to FIG. 4, a first area 410 and a third area 450 of the side surface section may be implemented in a first texture and a first color, and a second area 430 of the side surface section may be implemented in a second texture and a second color. Alternatively, the first area 410 of the side surface section may be implemented in the first texture and the first color, the second area 430 may be implemented in the second texture and the second color, and the third area 450 may be implemented in a third texture and a third color.

Referring to FIG. 5, a first area 510 and a third area 550 of the side surface section may be implemented in the first texture and the first color, and a second area 530 of the side surface section may be implemented in the second texture and the second color. A fourth area 570 and a fifth area 590 of the side surface section may be implemented in the third texture and the third color. The fourth area 570 and the fifth area 590 may be implemented in the third texture and the third color through a process of exposing the base material (e.g., a dia-cut process); however, the process of exposing the base material may be applied to other areas. The process of exposing the base material may be performed with respect to an upper end portion of the first area 510 or a lower end portion of the third area 550. The process of exposing the base material is a process of cutting the film by using a tool to expose the base material. The film may be cut straight, in a concave shape, or in a convex shape according to the tools used.

Although FIGS. 4 and 5 illustrate that multiple textures and multiple colors are applied to the side surface section of the housing 110, multiple textures and multiple colors may be applied to other areas of the housing 110. Mutually different textures and mutually different colors may be applied to mutually different areas of one surface of the housing 110.

Figure 6:
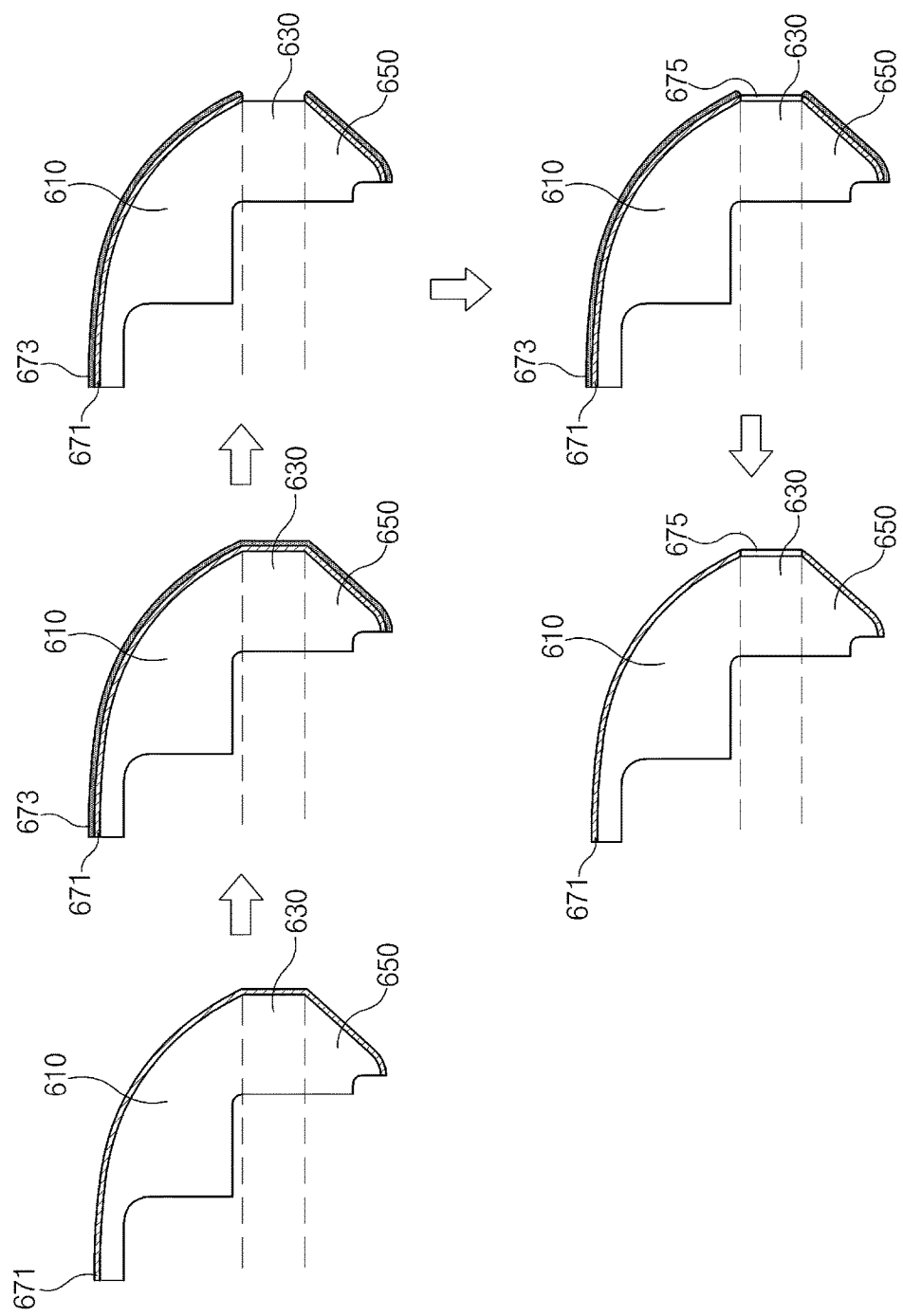
FIG. 6 illustrates a method of applying multiple textures and multiple colors to a housing of the electronic device, according to an embodiment of the present disclosure.

FIG. 6 illustrates a method of applying multiple textures and multiple colors to a housing, according to an embodiment of the present disclosure.

Multiple textures and multiple colors may be applied to a first area 610, a second area 630, and a third area 650 of the housing 110. First, a first texture and a first color may be applied to the first area 610, the second area 630, and the third area 650 of the housing 110. The first texture may be applied to the first area 610, the second area 630, and the third area 650 of the housing 110 through the sanding treatment, the hairline treatment, the hardfacing treatment, or the pattern treatment, and the first color may be applied to the first area 610, the second area 630, and the third area 650 of the housing 110 through the anodizing. As illustrated in FIG. 6, a first surface layer 671 is formed by applying the first texture and the first color to the housing 110.

After the first surface layer 671 is formed in the first area 610, the second area 630, and the third area 650 of the housing 110, a film may be formed in the first area 610, the second area 630, and the third area 650. A film layer 673 may be formed on the first surface layer 671. The film layer 673 may be formed through masking painting. Paints used in the masking painting may include, but are not limited to, asphalt containing a cobalt ingredient. The asphalt may be formed of compounds by binding hydrogen (H) and carbon (C) of high percentages with nitrogen (N), sulfur (S), and oxygen (O) of low percentages. Mineral pitch (e.g., Brea) may be formed in an initial step of forming petroleum. The mineral pitch mainly contains mine materials while petroleum asphalt, which remains after the petroleum is distilled, may not contain mine materials. The paints used in the masking painting may include a material having acid resistance, heat resistance, and impact resistance. In addition, the paints have to be removed without affecting the first surface layer 671. Accordingly, when the paints includes an asphalt ingredient, which has water resistance and chemical resistance, a solvent for removing the paints may include an organic chemical solvent of toluene or xylen.

The masking painting may be typically performed by using an air-gun spray. The film layer 673 may be formed with a thickness to tolerate an external physical or chemical influence. The thickness of the film layer 673 may vary as a discharge amount or the viscosity of paints is adjusted. The film layer 673 may be preferably formed with a thickness in the range of 10 μm to 50 μm. The film layer 673 may be dried in a thermal-drying manner, e.g., at the temperature in the range of 60 to 80° C. for the time of 30 minutes to 3 hours.

The film layer 673 may be formed through printing, a masking jig, or a tape in addition to the masking painting. For example, masking may be performed by using a jig or a tape based on the shape of the film layer 673.

After the film layer 673 is formed on the first surface layer 671, an area to which the second texture and the second color are to be applied, may be exposed to the outside. As illustrated in FIG. 6, the first surface layer 671 and the film layer 673 are removed from the second area 630 of the housing 110. Only the film layer 673 may be removed from the second area 630, or a portion of the first surface layer 671 and the film layer 673 may be removed from the second area 630. To expose the area to which the second texture and the second color are to be applied, computer numerical control (CNC) machining may be employed.

After the second area 630 of the housing 110 is exposed to the outside, the second texture and the second color may be applied to the second area 630. For example, the second texture may be applied to the second area 630 through the sanding treatment, the hairline treatment, the hardfacing treatment, or the pattern treatment, and the second color may be applied to the second area 630 through the anodizing. As illustrated in FIG. 6, a second surface layer 675 can be formed by applying the second texture and the second color to the second area 630 of the housing 110.

After the second surface layer 675 is formed, the film layer 673 may be removed from the first area 610 and the third area 650 of the housing 110. In this case, only the film layer 673 may be removed without affecting the first surface layer 671. A solvent for removing only the film layer 673 may include an organic solvent, such as a thinner, in a liquid phase, according to the types of painting films. In addition, a masking painting film may be dissolved by using a hydrocarbon agent such as toluene or xylene. The solvent may selectively vary with cleansing power. For example, the solvent may include halogenated hydrocarbon, alcohols, aldehyde, ether, ester, ketone, glycol ethers, or etc.

Removing the film layer 673 may be performed by dipping the film layer 673 into three-stage washing equipment such that the film layer 673 is dissolved in an organic chemical solvent. If the dipping of the film layer 673 is performed by rotating the housing 110 or by adding air bubbles, the film layer 673 may be easily removed. In addition, after the film layer 673 is removed, a washing process may be additionally performed to remove foreign matters from the surface of the housing 110. The washing process may include an ultrasonic washing process and a washing using a surfactant, acid, and alkali.

A process of exposing the base material may include applying an additional texture and an additional color. After the second area 630 of the housing 110 is exposed to the outside, the process of exposing the base material may be performed with respect to the second area 630. After the second color and the second texture are applied to the second area 630 of the housing 110, the process of exposing the base material may be performed with respect to the second area 630.

Figure 7A:
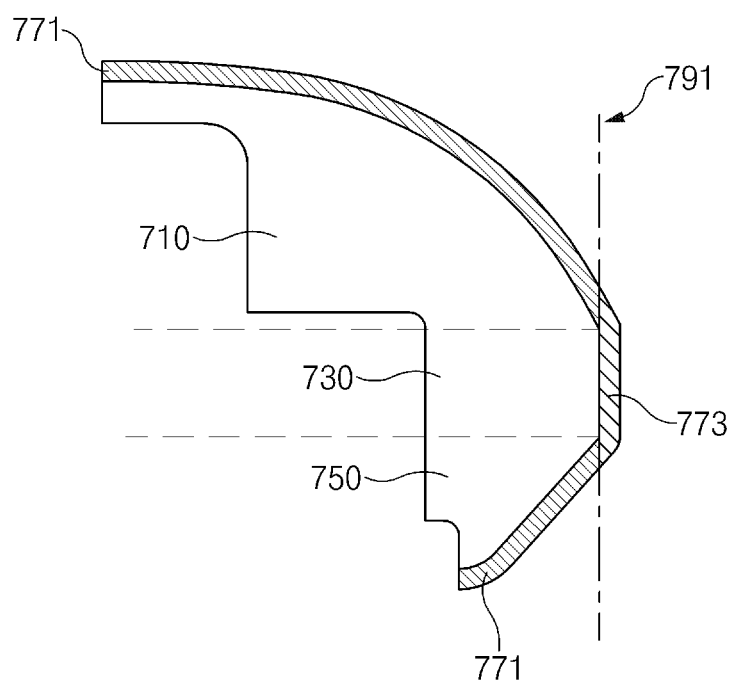
FIG. 7A is a diagram illustrating a method of exposing an area to which a different texture and a different color can be applied to the housing, according to an embodiment of the present disclosure.
Figure 7B:
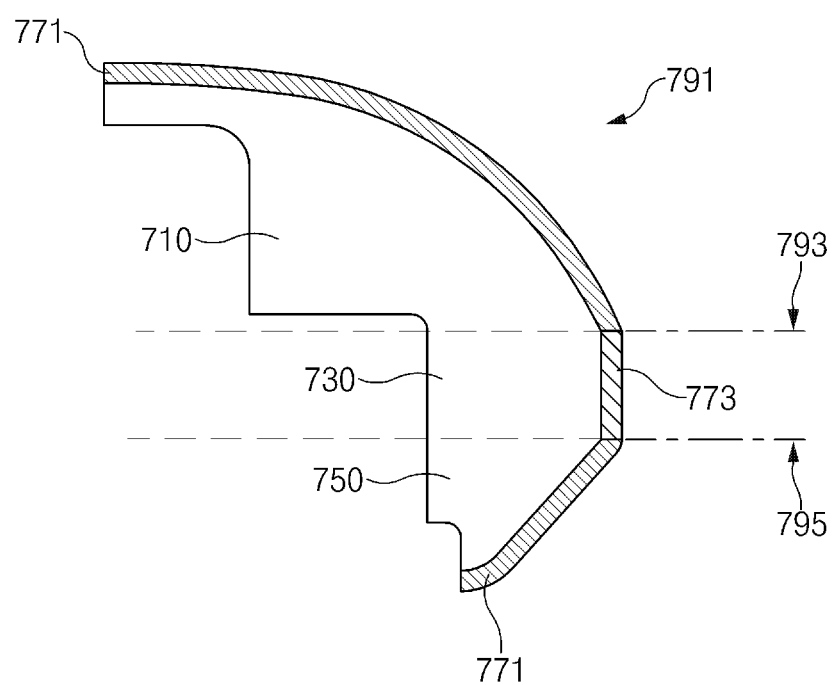
FIG. 7B is a diagram illustrating a method of exposing an area to which a different texture and a different color can be applied, according to another embodiment of the present disclosure.

FIG. 7A is a diagram illustrating a method of exposing an area to which a different texture and a different color are to be applied, and FIG. 7B is a diagram illustrating a method of exposing an area to which a different texture and a different color are to be applied, according to another embodiment of the present disclosure.

To apply the second texture and the second color, which are different from the first texture and the first color, respectively, and are applied to a first area 710 and a third area 750 of the housing 110, to a second area 730, a film may be removed from the second area 730. The film may be removed through CNC machining. The removal shape of the film may vary with the type and the direction of the CNC machining.

Referring to FIG. 7A, the film may be removed in a surface direction 791 of the second area 730 of the housing 110. For example, a CNC machining direction may be a direction parallel to the surface of the second area 730, and thus the film may be removed from the top to the bottom or from the bottom to the top. The film may be removed from the second area 730, from a portion of the first area 710, and from a portion of the third area 750. A second surface layer 773 formed by applying the second texture and the second color to the second area 730 may cover a portion of a first surface layer 771, which is formed by applying the first texture and the first color to the first area 710 and the third area 750.

Referring to FIG. 7B, the film may be removed in directions 793 and 795 perpendicular to the surface of the second area 730 of the housing 110. For example, the CNC machining direction may be a direction perpendicular to the surface of the second area 730, and thus the film may be removed from the right to the left or from the left or the right. Only the film formed on the second area 730 may be removed. Accordingly, the second surface layer 773 may be formed only on the second area 730. The thickness of the second surface layer 773 may be different from that of the first surface layer 771. To remove the step difference between the first surface layer 771 and the second surface layer 773, an additional process may be performed.

Figure 8:
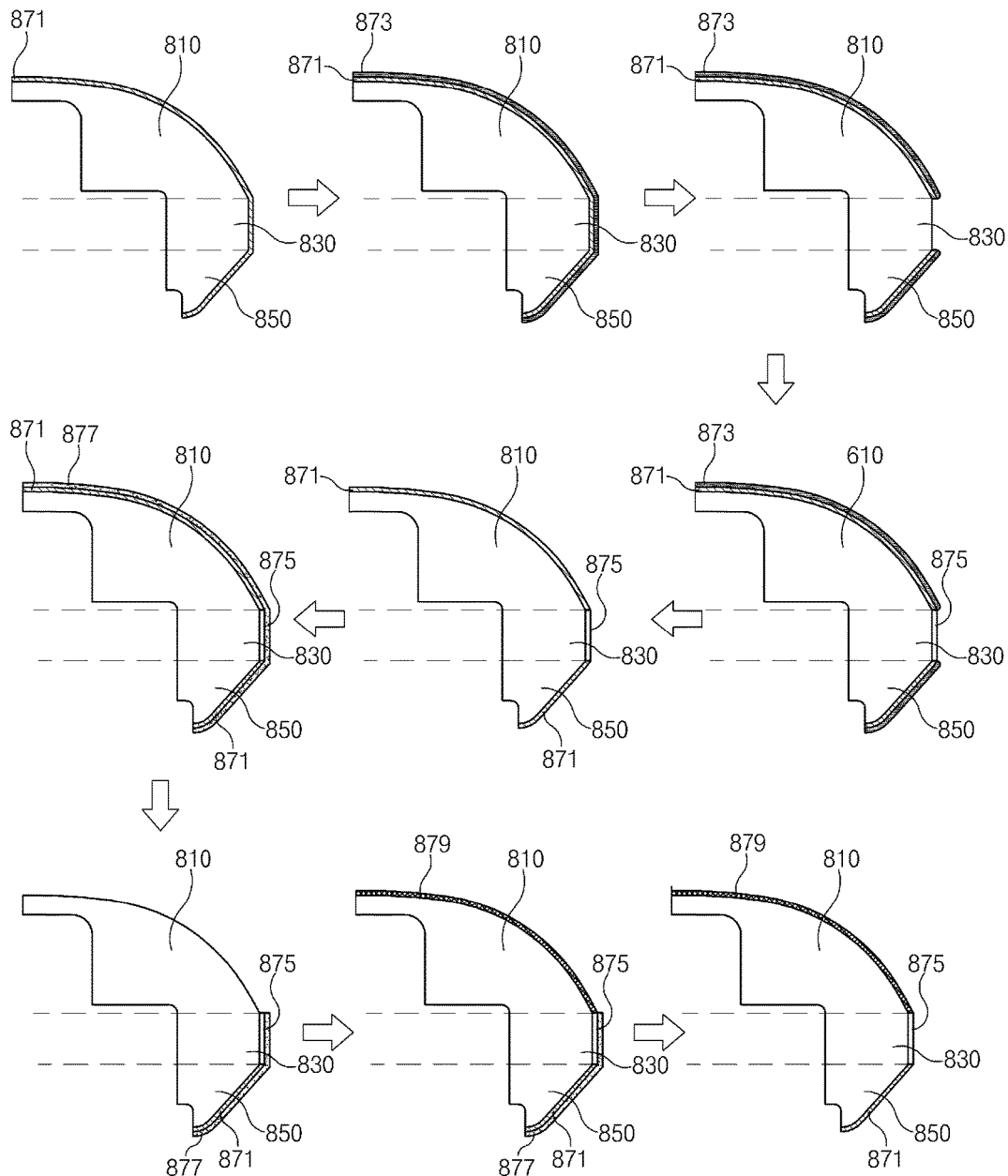
FIG. 8 illustrates a method of applying multiple textures and multiple sensors to the housing, according to another embodiment of the present disclosure.

FIG. 8 illustrates a method of applying multiple textures and multiple sensors to the housing, according to another embodiment of the present disclosure.

Mutually different textures and mutually different colors may be applied to a first area 810, a second area 830, and a third area 850 of the housing 110. First, a first texture and a first color may be applied to the first area 810, the second area 830, and the third area 850 of the housing 110. The first texture may be applied to the first area 810, the second area 830, and the third area 850 of the housing 110 through the sanding treatment, the hairline treatment, the hardfacing treatment, or the pattern treatment, and the first color may be applied to the first area 810, the second area 830, and the third area 850 through the anodizing. A first surface layer 871 can be formed by applying the first texture and the first color to the housing 110.

After the first surface layer 871 is formed in the first area 810, the second area 830, and the third area 850 of the housing 110, a film may be formed in the first area 810, the second area 830, and the third area 850. A first film layer 873 may be formed on the first surface layer 871. The first film layer 873 may be formed through masking painting.

After the first film layer 873 is formed on the first surface layer 871, an area, to which the second texture and the second color are to be applied, may be exposed to the outside. The first surface layer 871 and the first film layer 873 are removed from the second area 830. To expose the area to which the second texture and the second color are to be applied, the CNC machining may be used.

After the second area 830 of the housing 110 is exposed to the outside, the second texture and the second color may be applied to the second area 830. The second texture may be applied to the second area 830 through the sanding treatment, the hairline treatment, the hardfacing treatment, or the pattern treatment, and the second color may be applied to the second area 830 through the anodizing. A second surface layer 875 can be formed by applying the second texture and the second color to the second area 830 of the housing 110.

After the second surface layer 875 is formed, the first film layer 873 may be removed from the first area 810 and the third area 850 of the housing 110. Only the first film layer 873 may be removed without affecting the first surface layer 871. To remove the first film layer 873, the first film layer 873 may be dipped in three-stage washing equipment such that the first film layer 873 is dissolved in an organic chemical solvent. After the first film layer 873 is removed, a washing process may be additionally performed to remove foreign matters from the surface.

After the first film layer 873 is removed, a new film may be formed in the first area 810, the second area 830, and the third area 850. A second film layer 877 may be formed on the first surface layer 871 and the second surface layer 875. The second film layer 877 may be formed through the masking printing identically to or similarly to the first film layer 873.

After the second film layer 877 is formed, an area, to which the third texture and the third color are to be applied, may be exposed to the outside. The first surface layer 871 and the second film layer 877 can be removed from the first area 810 of the housing 110. To expose the area to which the third texture and the third color are to be applied, CNC machining may be used.

After the first area 810 of the housing 110 is exposed to the outside, the third texture and the third color may be applied to the first area 810. The third texture may be applied to the first area 810 through the sanding treatment, the hairline treatment, the hardfacing treatment, or the pattern treatment, and the third color may be applied to the first area 810 through the anodizing. A third surface layer 879 is formed by applying the third texture and the third color to the first area 810 of the housing 110.

After the third surface layer 879 is formed, the second film layer 877 may be removed from the second area 830 and the third area 850 of the housing 110. Only the second film layer 877 may be removed without affecting the first surface layer 871 and the second surface layer 875. The second film layer 877 may be dipped in washing equipment such that the second film layer 877 may be dissolved in an organic chemical solvent. After the second film layer 877 can be removed, a washing process may be additionally performed to remove foreign matters from the surface.

Through the above processes, the third texture and the third color may be applied to the first area 810 of the housing 110, the second texture and the second color may be applied to the second area 830, and the first texture and the first color may be applied to the third area 850. In addition, after the film is formed on the housing 110, only an area, to which a new texture and a new color are to be applied, may be exposed, and the new texture and the new color may be applied to the exposed area.

As described above, a housing of an electronic device may include a first surface facing in a first direction, a second surface facing in a second direction opposite to the first direction, a side surface surrounding at least a portion of a space formed between the first surface and the second surface, a first surface layer formed by applying a first texture and a first color to a first area of at least one of the first surface, the second surface, and the side surface of the housing, and a second surface layer formed by applying a second texture and a second color to a second area which is a portion of the first area. At least one of the first surface layer and the second surface layer may include an oxide film layer.

The first area may include at least a portion of the first surface, at least a portion of the second surface, and the side surface, and the second area may include at least a portion of the side surface.

The first area may include a curved surface.

The oxide film layer may include a plurality of fine dimples, each of the fine dimples may have a size and a depth less than a size and a depth of the first texture or the second texture, and at least one of the fine dimples may be sealed.

Dye may be inserted into the at least one of the fine dimples.

The housing may further include a third surface layer formed by applying a third texture and a third color to a third area which is a portion of the first area.

The first surface layer may be absent from the second area.

The first surface layer may have a thickness different from a thickness of the second surface layer.

As described above, an electronic device may include a housing which includes a first surface facing in a first direction, a second surface facing in a second direction opposite to the first direction, and a side surface surrounding at least a portion of a space formed between the first surface and the second surface, a display module seated inside the housing, a printed circuit board seated inside the housing, a first surface layer formed by applying a first texture and a first color to a first area of at least one of the first surface, the second surface, and the side surface of the housing, and a second surface layer formed by applying a second texture and a second color to a second area which is a portion of the first area. At least one of the first surface layer and the second surface layer may include an oxide film layer.

The first surface layer may be absent from the second area.

The first surface layer may have a thickness different from a thickness of the second surface layer.

Figure 9:
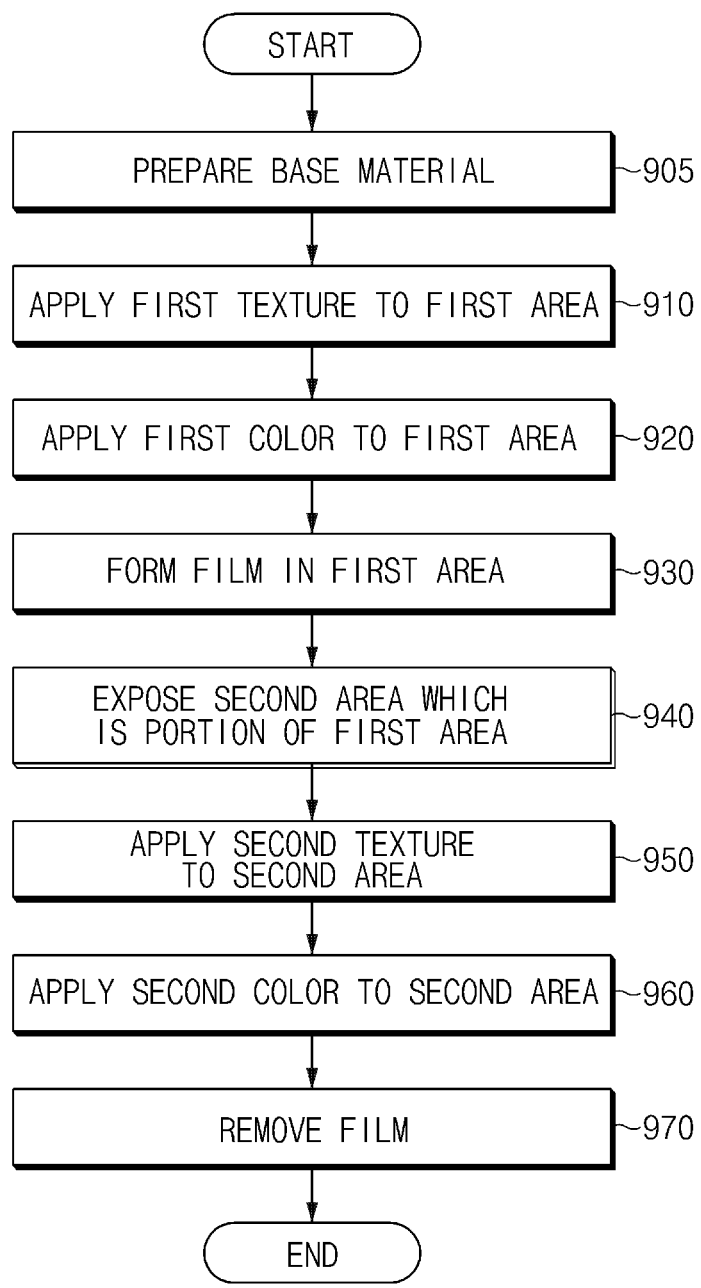
FIG. 9 is a flowchart of a method of applying multiple textures and multiple colors to the housing, according to an embodiment of the present disclosure.

FIG. 9 is a flowchart of a method of applying multiple textures and multiple colors to the housing, according to an embodiment of the present disclosure.

Referring to FIG. 9, a base material of the housing 110 may be prepared in step 905. The base material may include a material (e.g., metal) which allows for the anodizing. The housing 110 may include a metallic material such as aluminum (Al), magnesium (Mg), zinc (Zn), titanium (Ti), tantalum (Ta), hafnium (Hf), or niobium (Nb).

In step 910, the first texture may be applied to the first area of the housing 110. The first texture may be applied to the first area through the sanding treatment, the hairline treatment, the hardfacing treatment, or the pattern treatment. The first area may include the side surface section of the housing 110 (e.g., the portion of the front surface 111, the portion of the rear surface 113, and the side surface 115 of the housing 110). For example, the first area may include one surface of the housing 110 or may include the front surface 111, the rear surface 113, and the side surface 115 of the housing 110.

In step 920, the first color may be applied to the first area through the anodizing. The anodizing may be used to apply a color to the surface through a chemical polishing process, an oxide film process, a coloring process, and a sealing process.

In step 930, a film may be formed on the first area through the masking printing. Dyes used in the masking printing may include materials having acid resistance, heat resistance, and impact resistance; the dyes may contain asphalt ingredients.

In step 940, the second area, which is a portion of the first area, may be exposed to the outside through the CNC machining. When the second area is exposed, all layers covered on the second area may be removed, or only the film covered on the second area may be removed; the second area may be adjacent to the first area.

In step 950, the second texture may be applied to the second area through the sanding treatment, the hairline treatment, the hardfacing treatment, or the pattern treatment.

In step 960, the second color may be applied to the second area through anodizing.

In step 970, the film may be removed from the first area except for the second area. When the film is removed, a solvent for removing the film without affecting another component other than the film may be used. When the dyes, which contain an asphalt ingredient is used in the masking printing, an organic chemical solvent of toluene or xylen may be used.

Before the first texture and the first color are applied to the first area, the film is first formed on the second area. Then, the first texture and the first color may be applied to the first area. In addition, after the first texture and the first color are applied to the first area, the film is removed from the second area. Thereafter, the second texture and the second color may be applied. In this case, at least two color tones and textures may be applied to the first area.

As described above, a method of manufacturing a housing of an electronic device may include applying a first texture to a first area of the housing, applying a first color to the first area, forming a film in the first area, exposing a second area which is a portion of the first area, applying a second texture to the second area, applying a second color to the second area, and removing the film. At least one of the applying of the first color and the applying of the second color may include performing anodizing.

The applying of the first texture and the applying of the second texture may include performing at least one of sanding treatment, hairline treatment, hardfacing treatment, and pattern treatment.

The performing of the anodizing may include forming an oxide film layer including a plurality of fine dimples, each of the fine dimples may have a size and a depth less than a size and a depth of the first texture or the second texture, and at least one of the fine dimples may be sealed.

The performing of the anodizing may further include inserting dye into the at least one of the fine dimples.

The forming of the film may include performing masking painting.

The performing of the masking painting may include selecting a material including a cobalt ingredient as paint used for the masking painting.

The exposing of the second area may include performing computer numerical control (CNC) machining.

The removing of the film may include dissolving the film by using an organic chemical solvent.

The organic chemical solvent may include toluene or xylene.

Figure 10:
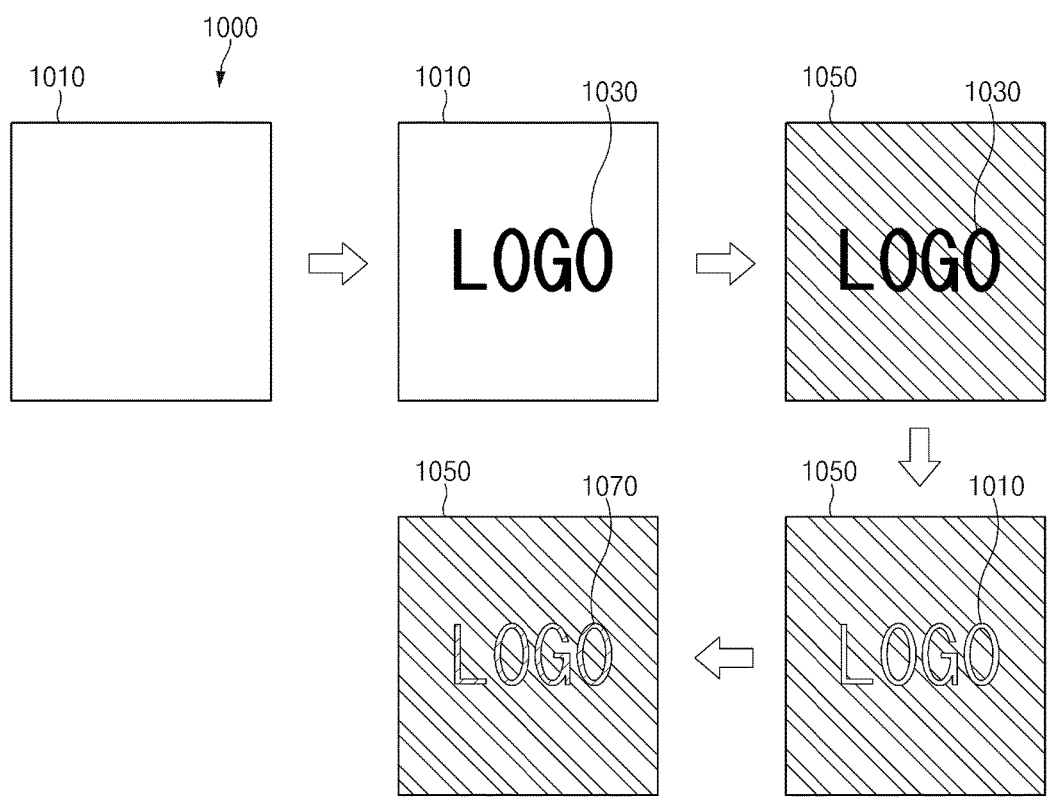
FIG. 10 is a diagram illustrating a method of applying multiple textures and multiple colors to a housing including a logo, according to an embodiment of the present disclosure.

FIG. 10 is a diagram illustrating a method of applying multiple textures and multiple colors to a housing including a logo, according to an embodiment of the present disclosure.

Referring to FIG. 10, various patterns, such as a logo, may be printed on one surface 1000 (e.g., the rear surface 113) of the housing 110. Mutually different textures and mutually different colors may be applied to the surface 1000 of the housing 110 including the logo and the logo. First, a first surface layer 1010 may be formed by applying the first texture and the first color to the surface 1000 of the housing 110. Partial masking serving as printing may be performed with respect to the surface 1000 of the housing 110, which has the first surface layer 1010. A film layer 1030 may be formed in variously-shaped patterns such as a logo and formed on the surface 1000 of the housing 110. The film layer 1030 may cover a portion of the first surface layer 1010.

The second texture and the second color may be applied to the surface 1000 of the housing 110 covered with the first surface layer 1010 and the film layer 1030. A second surface layer 1050 may be formed by applying the second texture and the second color to the first surface layer 1010 and the film layer 1030 and thus may cover the first surface layer 1010 and the film layer 1030. The second surface layer 1050 may not be formed on the film layer 1030, e.g., may be formed to cover only the first surface layer 1010.

After the second surface layer 1050 is formed, the film layer 1030 may be removed. If the film layer 1030 is removed, only the first surface layer 1010 applied with the first texture and the first color may remain in the area having no the first film layer 1030. The third texture and the third color may be applied to the area having no the film layer 1030, that is, having only the first surface layer 1010. A third surface layer 1070 may be formed by applying the third texture and the third color to cover the first surface layer 1010.

In accordance with the present disclosure, electronic devices can be manufactured having various designs with their housings implemented in multiple textures and multiple colors.

At least a part of the devices (e.g., modules or functions thereof) or methods (e.g., operations) described herein may be implemented as instructions stored in a non-transitory computer-readable storage medium in the form of a program module. In the case where the instructions are performed by a processor, the processor may perform functions corresponding to the instructions. The non-transitory computer-readable storage medium may be, for example, a memory.

A non-transitory computer-readable recording medium may include a hard disk, a floppy disk, a magnetic medium (e.g., a magnetic tape), an optical medium (e.g., a computer disc (CD)-read only memory (ROM), digital versatile disc (DVD)), a magneto-optical medium (e.g., a floptical disk), or a hardware device (e.g., a ROM, a read access memory (RAM), a flash memory, etc.). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. A housing of an electronic device, the housing comprising:
    a first surface;
    a second surface;
    a side surface surrounding at least a portion of a space formed between the first surface and the second surface;
    a first surface layer formed by applying a first texture and a first color to a first area of at least one of the first surface, the second surface, and the side surface of the housing; and
    a second surface layer formed by applying a second texture and a second color to a second area, which is within the first area,
    wherein at least one of the first surface layer and the second surface layer includes an oxide film layer,
    wherein the first area includes a portion of the first surface, a portion of the second surface, and the side surface, and
    wherein the second area includes a portion of the side surface.

2. The housing of claim 1, wherein the first area includes a curved surface.

3. The housing of claim 1, wherein the oxide film layer includes a plurality of dimples,
    wherein each of the dimples has a size and a depth less than a size and a depth of the first texture or the second texture, and
    wherein at least one of the dimples is sealed.

4. The housing of claim 3, wherein dye is inserted into the at least one of the dimples.

5. The housing of claim 1, further comprising:
    a third surface layer formed by applying a third texture and a third color to a third area which is a portion of the first area.

6. The housing of claim 1, wherein the first surface layer is not provided in the second area.

7. The housing of claim 6, wherein the first surface layer has a thickness that is different from a thickness of the second surface layer.

8. An electronic device comprising:
    a housing which includes a first surface, a second surface, and a side surface surrounding a portion of a space formed between the first surface and the second surface;
    a display module;
    a printed circuit board;
    a first surface layer formed by applying a first texture and a first color to a first area of at least one of the first surface, the second surface, and the side surface of the housing; and
    a second surface layer formed by applying a second texture and a second color to a second area, which is within the first area,
    wherein at least one of the first surface layer and the second surface layer includes an oxide film layer,
    wherein the first area includes a portion of the first surface, a portion of the second surface, and the side surface, and
    wherein the second area includes a portion of the side surface.

9. The electronic device of claim 8, wherein the first surface layer is not provided in the second area.

10. The electronic device of claim 9, wherein the first surface layer has a thickness that is different from a thickness of the second surface layer.

11. An electronic device comprising:
- a housing which includes a first surface, a second surface, and a side surface surrounding a portion of a space formed between the first surface and the second surface;
- a display module;
- a printed circuit board;
- a first surface layer formed by applying a first texture and a first color to the first surface of the housing; and
- a second surface layer formed by applying a second texture and a second color to the side surface,
- wherein at least one of the first surface layer and the second surface layer includes an oxide film layer, and
- wherein the first texture or the first color that is applied to the first surface of the housing is different than the second texture or the second color that is applied to the side surface.

\* \* \* \* \*